United States Patent [19]

Parker et al.

[11] Patent Number: 5,604,628
[45] Date of Patent: Feb. 18, 1997

[54] OPTICAL LASER AMPLIFIER COMBINED WITH A SPONTANEOUS EMISSION FILTER

[75] Inventors: Michael A. Parker, Liverpool, N.Y.; Paul D. Swanson, Solana Beach, Calif.; Stuart I. Libby, Albuquerque, N.M.; Douglas B. Shire; Chung C. Tang, both of Ithaca, N.Y.

[73] Assignee: Cornell Research Foundation, Inc., Ithaca, N.Y.

[21] Appl. No.: 366,218

[22] Filed: Dec. 30, 1994

[51] Int. Cl.$^6$ .................................. H01S 3/00; G02F 3/00
[52] U.S. Cl. ..................... 359/344; 359/337; 359/108; 385/1
[58] Field of Search .................................. 359/237, 244, 359/344, 337; 385/1, 14

[56] References Cited

U.S. PATENT DOCUMENTS

| | | |
|---|---|---|
| 3,431,437 | 3/1969 | Kosonocky . |
| 4,825,442 | 4/1989 | Fitz . |
| 4,902,980 | 2/1990 | O'Meara . |
| 4,945,531 | 7/1990 | Suzuki . |
| 5,155,621 | 10/1992 | Takeda et al. . |
| 5,218,665 | 6/1993 | Grasso et al. . |
| 5,283,686 | 2/1994 | Huber . |
| 5,283,845 | 2/1994 | Ip ............................................. 385/24 |
| 5,309,268 | 5/1994 | Nakamura et al. . |
| 5,436,759 | 7/1995 | Dijaili et al. ............................ 359/333 |

*Primary Examiner*—Mark Hellner
*Attorney, Agent, or Firm*—Jones, Tullar & Cooper, P.C.

[57] ABSTRACT

Optical laser amplifier devices are formed integrally with spontaneous emission filters. The filtering function is accomplished by a laser amplifier whose output is employed to quench the signal generated by a laser. The quenching of the laser is performed in direct proportion to the stimulated emission component of the laser amplifier output signal. Since the stimulated emission component represents the output signal minus any spontaneous emission noise, the output signal generated by the laser is an amplified, inverted version of the input signal without the noise components. In the preferred embodiments, optical waveguides are employed to form the laser amplifier and the laser is either a horizontal cavity edge emitting laser or a vertical cavity surface emitting laser (VCSEL).

20 Claims, 3 Drawing Sheets

OPTICAL LASER AMPLIFIER COMBINED WITH A SPONTANEOUS EMISSION FILTER

BACKGROUND OF THE INVENTION

The present invention arose out of research sponsored by the USAF Rome Laboratory under contract number F30602-92-C-0038. The U.S. government has rights in the invention.

The present invention relates to an optical laser amplifier structure which is integrally combined with a spontaneous emission filter for substantially improving the signal to noise ratio of the amplifier.

Optical laser amplifiers are used to increase the amount of signal from a device or system in which a signal is conveyed by stimulated emission, i.e., a laser beam. These amplifiers are common in fiber communication networks and switching systems for example. The output from an optical amplifier generally consists of the amplified stimulated emission plus a certain amount of unwanted spontaneous emission. The spontaneous emission occurs as a result of random recombination of carriers in the laser amplifier: this random recombination does not contribute to the amplified stimulated emission. The spontaneous emission can be referred to as noise in the signal. Noise corresponds to the integral over wavelength of the spontaneous emission, otherwise known as the total spontaneous power. The spontaneous emission has broad bandwidth compared with the amplified signal. In the case of an optical laser amplifier having a low signal to noise ratio, a photodetector used to detect the signal will produce photocurrent that is orders of magnitude larger for the integrated spontaneous emission than for the amplified stimulated emission. In such case, it is difficult to separate the signal from the noise.

Several techniques can be used to extract the optical signal from the noise. In the laboratory, the signal can be viewed on an optical spectrum analyzer with sufficient resolution. Lock-in amplifiers can also be used. However, both of these devices are large, costly and slow. Another method uses holograms to redirect the laser light which results in spatial separation between the stimulated and spontaneous emission. However, the hologram introduces additional optical losses, and it is large and mechanically unstable. The same is true for fiber based systems. In some applications, the optical signal must be electronically reconstructed to obtain the required amplification due to the large noise accrued by cascaded optical amplifiers. This reconstruction process consists of detecting the optical signal at a point of relatively large signal to noise ratio, electronically amplifying and processing the detected signal, and then retransmitting it through a laser.

In view of the foregoing, a need therefore exists for a faster, cheaper, less complex and smaller means by which noise can be filtered from an optical laser amplifier's output signal.

SUMMARY OF THE INVENTION

The foregoing need is fulfilled by the present invention through provision of an optical laser amplifier that has a spontaneous emission filter formed integrally therewith. Broadly, the combined amplifier and filter device comprises a waveguide type optical amplifier and a semiconductor laser. The amplifier's output signal is employed to quench, and therefore act as a modulating signal for, the laser. This quenching action is selective, however, in that only the stimulated component of the amplifier's output signal quenches the laser signal, while the spontaneous emission or noise component has no effect on it. This quenching action therefore provides the filtering function. Since the amplifier signal quenches the laser signal in direct proportion to the intensity of the stimulated component in the amplifier signal, the laser signal is effectively inverse modulated so that the laser signal is an inverted and filtered version of the amplifier's signal.

In a first preferred embodiment of the invention, the laser is an edge emitting laser formed in a waveguide positioned perpendicular to an adjacent output end of an amplifier waveguide. This embodiment employs an absorber section formed on the substrate directly across the laser from the output end of the amplifier which reduces back reflections into the amplifier, and reduces the necessity of antireflection coatings. Alternatively, an antireflection coated facet can be formed on the side of the laser opposite the output end of the amplifier which provides a second, unfiltered amplified signal output. In a second preferred embodiment of the present invention, the optical amplifier is formed in a waveguide on a semiconductor substrate, and the laser is a vertical cavity surface emitting laser (VCSEL) that is formed on the substrate adjacent the output end of the amplifier so that the amplifier signal is directed transversely across the laser cavity to provide the desired quenching action. Finally, in a third embodiment of the invention, a zigzag shaped quench section is connected to the output end of the amplifier, and includes a plurality of parallel legs which intersect a waveguide laser, and thereby provide quenching of the laser signal at a plurality of locations along its length. In the second and third embodiments, the unfiltered amplifier signal is also available in addition to the filtered output signal from the laser as in the first alternative version of the embodiment.

BRIEF DESCRIPTION OF THE DRAWINGS

The features and advantages of the present invention will become apparent from the following detailed description of a preferred embodiment thereof, taken in conjunction with the accompanying drawings in which.

DETAILED DESCRIPTION OF THE PREFERRED EMBODIMENTS

Figure 1:
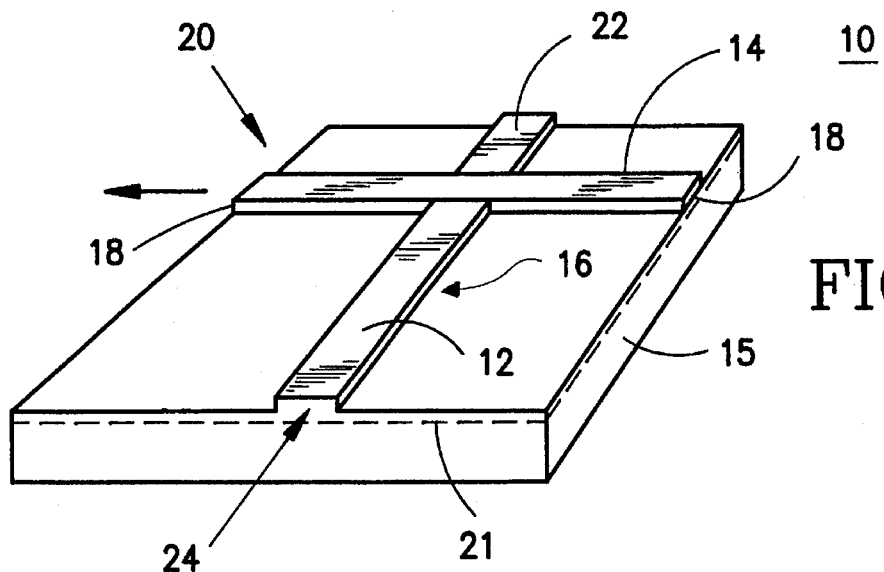
FIG. 1 is a diagrammatic perspective illustration of a first preferred embodiment of the present invention comprising a combined laser amplifier and spontaneous emission filter device formed from first and second perpendicular optical waveguides.

FIG. 1 illustrates a first preferred embodiment of the present invention comprising a monolithically integrated optical laser amplifier and spontaneous emission filter device 10. The device 10 includes first and second optical waveguides 12 and 14 that are formed on a semiconductor substrate 15. The waveguides are perpendicular to one another and are independently electrically pumped. The first waveguide 12 forms an amplifier 16, while the second waveguide 14, combined with first and second end mirrors 18, forms a horizontal cavity edge emitting laser 20. A multiple quantum well structure 21 is formed in the substrate 15 for this purpose.

The amplifier 16 provides normal signal amplification and quenches off the laser 20. Although not clearly shown in FIG. 1, each side of the first waveguide 12 preferably makes a 2° angle with its longitudinal axis. This is so that the size of an intersection region with the laser 20 is increased, as is the quenching efficiency, and further so that the saturation characteristics of the amplifier 16 are improved. An absorber 22 is also provided adjacent the side of the laser 20 opposite from the amplifier 16 which substantially eliminates back reflections into the amplifier 16. Alternatively, an antireflection coating can be formed on the side wall of the second waveguide 14 to serve the same purpose, and provide an optional second, unfiltered amplified output signal from the device 10.

The amplifier and filter device 10 operates with the laser 20 biased above threshold and the amplifier 16 biased for optical gain. An optical laser input signal 24 is supplied to the amplifier 16. This relatively weak input signal is amplified as it travels the length of the waveguide 12. As is conventional, the amplifier 16 also adds spontaneous emission to the output signal fed across the laser 20. However, an amplified signal free of influence by this spontaneous emission component is emitted by the laser 20. This is because the output signal from the amplifier 16 quenches the laser 20 in direct proportion to the magnitude only of the stimulated emission component of the amplifier's output signal as it travels transversely across the laser's waveguide 14. It should be noted that the stimulated emission in the filtered laser signal is orders of magnitude larger than the spontaneous emission because the carriers in the laser cavity preferentially recombine under the action of the impressed optical field to produce stimulated emission, rather than recombining by the slower random process that produces spontaneous emission. The amplifier's output signal then enters the absorber 22 where the emission is absorbed to prevent it from reflecting back into the amplifier 16, and otherwise limiting its useful gain. The absorber 22 can be reverse biased to further increase the absorption if desired.

Figure 2A:
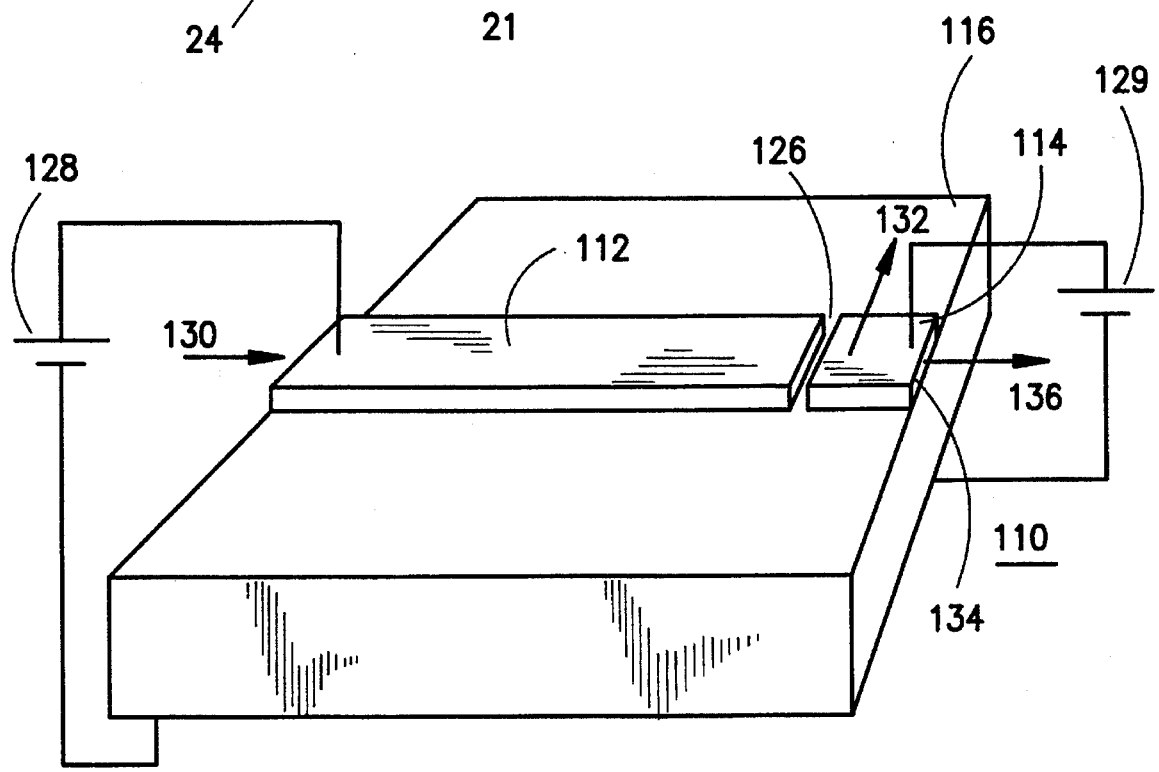
FIG. 2A is a diagrammatic perspective illustration of a second preferred embodiment of the present invention which is formed from a waveguide amplifier and a vertical cavity surface emitting laser.

Turning now to a second preferred embodiment of the present invention, FIG. 2A illustrates another monolithically integrated optical laser amplifier and spontaneous emission filter device 110. This device differs from the device 10 of FIG. 1 in that it employs a vertical cavity surface emitting laser (VCSEL) instead of a horizontal cavity edge emitting laser. In particular, the device 110 includes an optical waveguide amplifier 112 and a VCSEL 114, both of which are formed on a semiconductor substrate 116.

Figure 2B:
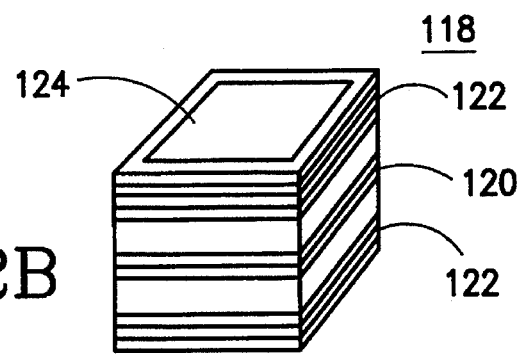
FIG. 2B is a diagrammatic perspective illustration of the heterostructure which forms the amplifier and laser of the second preferred embodiment.

The amplifier 112 and the VCSEL 114 are both constructed from a heterostructure 118 as illustrated in FIG. 2B. The heterostructure 118 is formed from any suitable semiconductor material and includes a multiple quantum well structure 120 which is sandwiched between first and second Distributed Bragg Reflector (DBR) mirror stacks 122. Each of the DBR mirror stacks 122 is of conventional construction, and is typically formed of alternating layers of GaAs and AlGaAs, each layer being a quarter wavelength thick. A first, p-type contact 124 is formed on the top exposed surface of the heterostructure 118, while a second, n-type contact (not shown) is formed on the bottom exposed surface of the heterostructure 118. The contacts are employed to apply a bias current to the multiple quantum well structure 120 through the first and second DBR mirror stacks 122. Alternatively, the bias current can be applied directly to the multiple quantum well structure 120.

A vertical cut 126 is formed in the heterostructure 118 during fabrication to separate the amplifier 112 and VCSEL 114 electrically from one another. As illustrated schematically in FIG. 2A, separate bias currents are therefore applied to the amplifier 112 and the VCSEL 114 by first and second voltage sources 128 and 129, respectively. This is necessary to provide the necessary adjustability of the amplifier's gain and VCSEL's drive current for proper operation of the amplifier and filter device 110.

Since the waveguide amplifier 112 is substantially longer than it is wide, it acts to amplify an input optical laser signal 130 in the horizontal direction because of the resulting higher gain in that direction. On the other hand, the VCSEL 114, which is shown as being essentially square, has a higher gain in a vertical direction by virtue of the DBR mirror stacks 122, and thereby generates an output signal 132 in the vertical direction. This output signal 132 is an inverted, filtered version of the output signal from the amplifier 112 that is used to quench the VCSEL 114. The VCSEL 114 also includes a cleaved sidewall facet 134 having an antireflection coating formed thereon which prevents the amplifier's output signal from reflecting back through the VCSEL 114, and disrupting operation of the device. The amplifier's output signal therefore passes unaltered through the cleaved facet 134, and thereby provides a second, unfiltered amplified output signal 136 for the device 110.

The advantages of the second preferred embodiment are that it has a narrow line width and a symmetrical output beam emitting perpendicular to the surface of the substrate 116. Optical fibers can also be easily attached to the output of the VCSEL 114 with better coupling coefficients than in the embodiment of FIG. 1. Further, because of the geometry of the second embodiment, both ends of the amplifier 112 can be antireflection (AR) coated for high gain.

Figure 3:
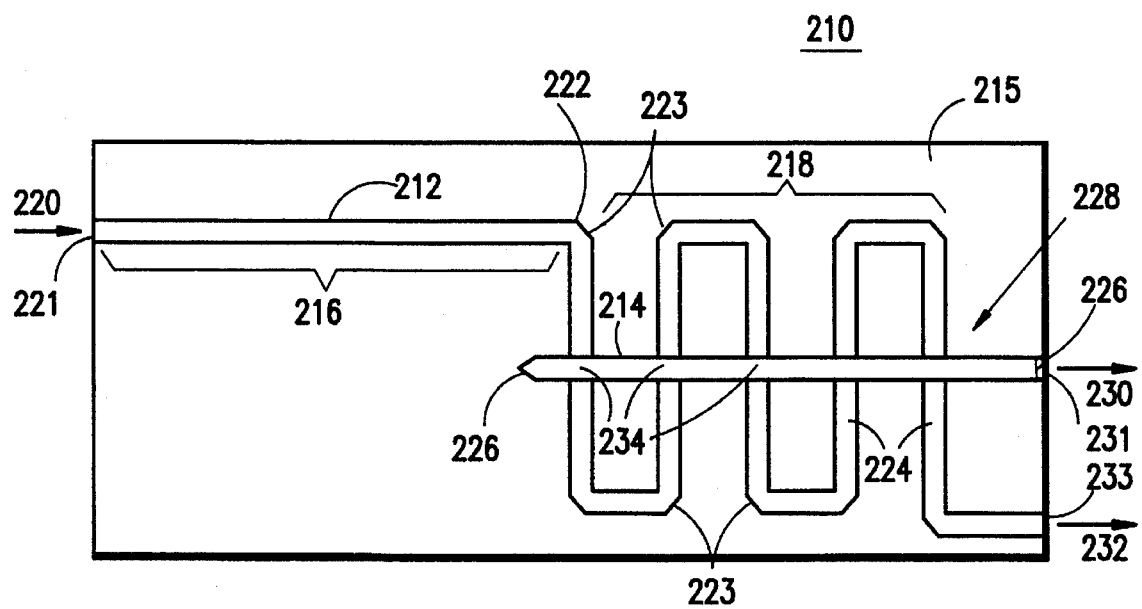
FIG. 3 is a schematic illustration of a third preferred embodiment of the present invention which includes a waveguide amplifier with a zigzag shaped quench section, and a waveguide laser.

FIG. 3 illustrates a third preferred embodiment of the present invention comprising a monolithically integrated optical laser amplifier and spontaneous emission filter device 210 which includes first and second optical waveguides 212 and 214 formed on a semiconductor substrate 215. The first waveguide 212 is divided into two sections; an amplifier section 216 and a quench section 218. The amplifier section 216 acts as a conventional laser amplifier, and increases the magnitude of a laser signal 220 applied to its input 221. As is also conventional, the amplifier section 216 adds a spontaneous emission noise component to the amplified output signal at a junction 222 between the amplifier section 216 and the quench section 218.

In the quench section 218, the first waveguide 212 has a zigzag shape by virtue of a plurality of 90° angle bends formed therein. A plurality of turning mirrors 223 positioned at 45° angles to the longitudinal axis of the waveguide 212 is employed to redirect the optical signal at each bend. The resulting structure of the quench section 218 includes a plurality of parallel legs 224, each of which are intersected by the second waveguide 214 for reasons to be discussed shortly. The second waveguide 214 includes first and second end mirrors 226 which combine with it to form a horizontal cavity edge emitting laser 228 that is positioned perpendicularly to the parallel legs 224 of the quench section 218.

The amplifier and filter device 210 generates a first, filtered amplified output signal 230 from an output facet 231 of the laser 228 and a second, unfiltered amplified output signal 232 from an output facet 233 of the quench section 218 of the first waveguide 212. In operation, the laser 228 is biased above threshold and a separate optical laser signal is applied to the input 221 of the amplifier section 216. In the quench section 218, the amplified optical signal encounters two distinct regions. One region is identical in function to the amplifier section 216 by providing additional gain. The other region is actually formed of a plurality of subregions 234 where the parallel legs 224 in the quench section 18 are intersected by the second waveguide 214. This is where the actual laser quenching occurs as discussed below, and these subregions 234 of intersection can either increase or decrease the optical signal in the quench section 218.

At quiescence, the filtered output signal 230 is an unmodulated laser signal. However, when the amplified optical signal enters the quench section 218 and passes through each of the subregions 234, it quenches off the laser 228 in direct proportion to the intensity of the stimulated component of the amplified optical signal. Thus, as in the first and second embodiments, the amplified signal produces a decrease in the intensity of the filtered output signal 230, and thus the filtered output signal 230 is an inverted and filtered version of the amplified signal. The unfiltered, amplified output 232 of the quench section 218 presents the normal amplified signal along with the spontaneous emission or noise.

Figure 4:
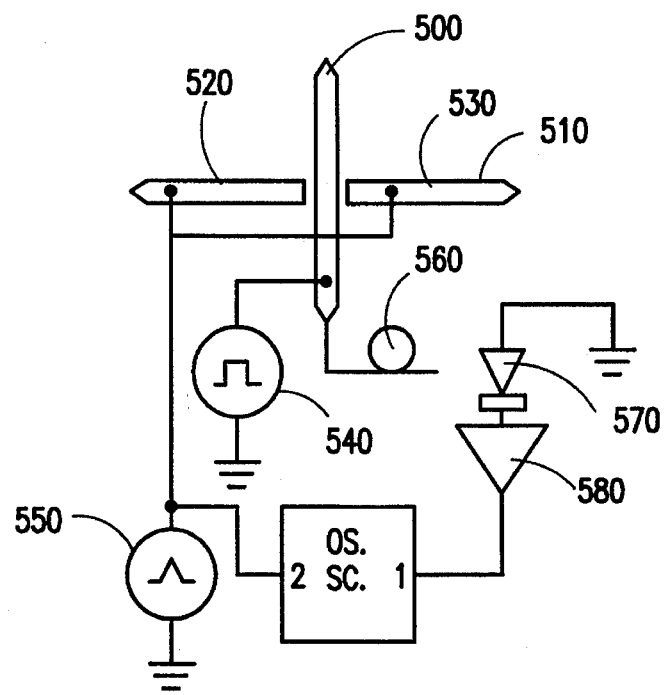
FIG. 4 is a schematic diagram of a circuit employed in a laser quenching experiment used to test the operational theory of the preferred embodiments of the present invention.

The quenching of one laser by another is thus the key to the operation of the spontaneous emission filter in the amplifier and filter devices of FIGS. 1–3. To properly understand the quenching phenomenon, an experiment was performed using the circuit of FIG. 4. In particular, FIG. 4 shows first and second GaAs-AlGaAs heterostructure lasers 500 and 510, both of which emitted at 860 nm. The two lasers were configured so that the first, main laser 500 was capable of being quenched off by the second, side quench laser 510. The quench laser 510 is divided into first and second parts 520 and 530 which are separated by the gain region of the main laser 500 so that the quench and main laser cavities intersect. The two parts 520 and 530 of the quench laser 510 are electrically connected in parallel. The mirrors employed by both of the lasers 500 and 510 are near total internal refection mirrors to improve the laser threshold currents and decrease the power consumption of the device.

The laser quenching experiment was performed as follows. Both of the lasers 500 and 510 were pulsed by applying a square voltage pulse from a first pulse generator 540 to the main laser 500 for 10 microseconds, and synchronously applying a triangular pulse from a second pulse generator 550 to the quench laser 510 for 10 microseconds. Light escaping from the tip of the main laser TIR mirror was then coupled into a single mode fiber 560 and routed to a PIN photodiode circuit 570 whose output was fed to an amplifier 580. The signals proportional to the emitted optical power from the output of the amplifier 580, and the current fed to the quench laser 510 were plotted on a digital oscilloscope 590.

The graphs shown in FIG. 3 plot the optical power emitted from the main laser 500 as a function of the current injected into the quench laser 510; the power has been normalized to unity. Each point of the graph presents the pair of numbers formed by the irradiance from the main laser and the corresponding current causing the irradiance. The set of three curves were obtained from a main laser that had a threshold current of 36 mA. Each curve is labelled by the amount of current injected into the main laser (44, 56 and 66 mA).

A maximum of approximately 80% of the optical power from the main laser 500 could be quenched; this value depends on the construction of the invention. It should be noted that the main laser intensity decreases linearly as the quench laser current increases. Further, more quench laser current is required for larger main laser currents in order to maintain a constant amount of quench. This plot can be reinterpreted in terms of the optical power emitted from the quench laser 510 as follows. The threshold current for the quench laser 510 is near 50 mA. If the origin of the graph is translated to that point, then a change in quench laser output power is linearly related to the new variable $I'=I-40$ mA, where I is the current in the quench laser 510. Changes in the output power of the quench laser 510 operated above threshold then yield linear changes in the output power of the main laser 500. For a given change in the optical power from the quench laser 510, the graph shows that the main laser 500 has smaller changes in output power at high current bias than at low bias.

Figure 5:
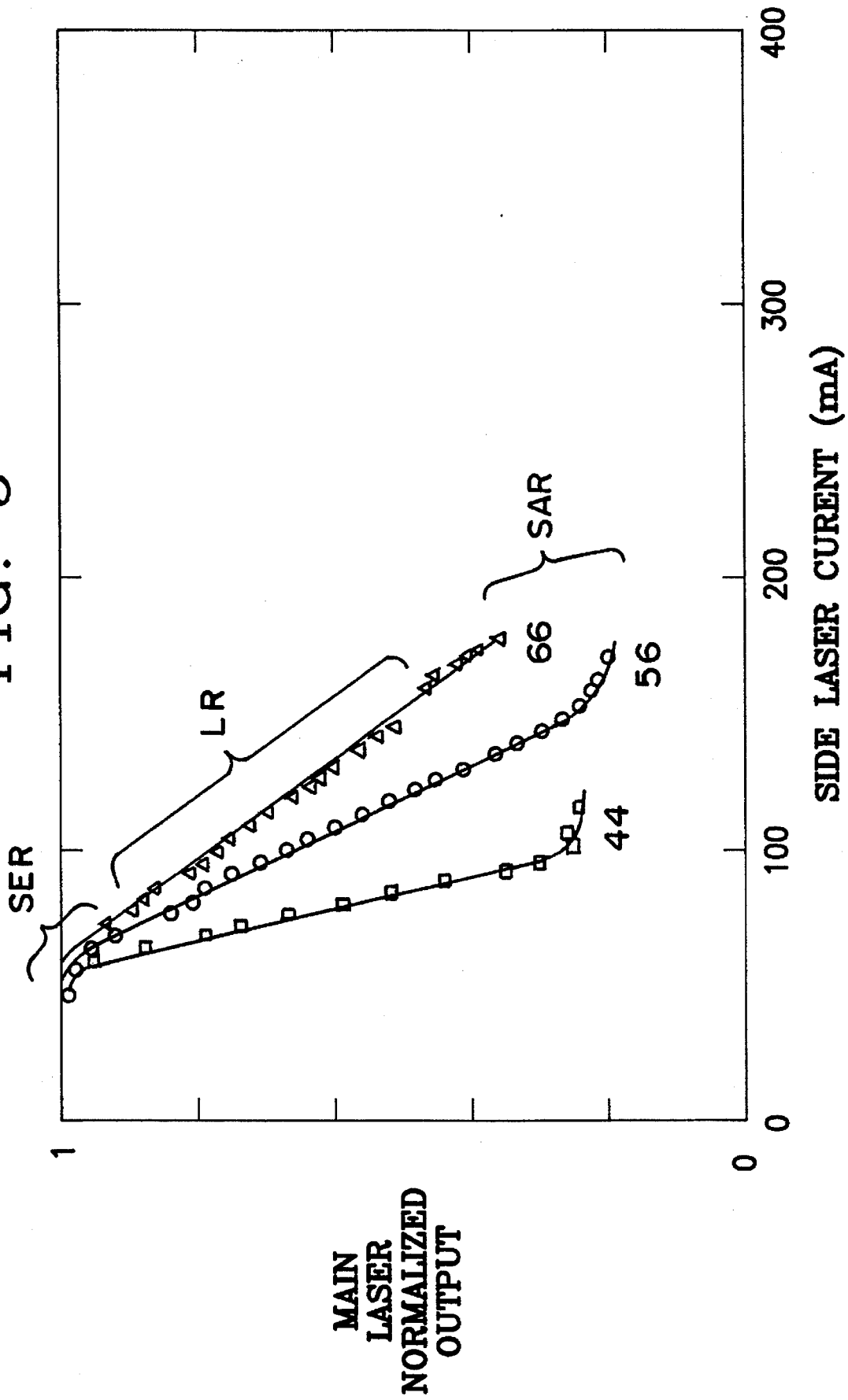
FIG. 5 is a graph of the laser quenching in three separate experiments performed on the circuit of FIG. 4.

The quench curves in FIG. 5 include a spontaneous emission region SER, a linear region LR and a saturation region SAR. The spontaneous emission region SER corresponds to quench laser currents smaller thorn about 50 mA and this region is due to the lack of stimulated emission in the quench laser 510. The optical power from the main laser 500 can increase to values larger than 1 if the electrical resistance between the main and quench lasers is sufficiently small, or if the spontaneous emission from the quench laser 510 aids the pumping of the main laser cavity. The linear region LR refers to that part of the graph where the optical power from the main laser 500 linearly decreases. For this region, a photon from either the quench or main laser cavity can stimulate the emission of a photon from electron-hole recombination in such a way that the wave vector of this emission is parallel to either the quench or main laser cavity, respectively. However, above threshold, the photon density in the quench laser 510 is linearly proportional to the quench laser pump current. Thus, the probability of interaction between the photons from the quench laser 510 and electron-hole pairs in the common cavity increases linearly. As a result, the gain of the main laser 500 linearly decreases to a fixed value. Main lasers operating at higher current densities require larger quench laser currents to achieve the same amount of quench. The saturation region SAR is where the emitted optical power saturates; this region occurs for relatively large values of the quench current. For small volumes of the common cavity, the main laser 500 cannot be quenched and the intensity of the stimulated emission corresponds to the observed saturation level. For volumes of the common cavity sufficiently large to allow for the main laser 500 to be quenched, any observed saturation level would be attributable to the intensity of the spontaneous emission from the main laser 500.

In commercial use of any of the devices 10, 100 or 210 in analog and digital communications applications, optical fibers would normally be fitted to the input and output ports of the devices. The quiescent laser output from the filtered output is set by the amount of current injected into the laser section. In some applications, a thermal electric cooler could be added to keep the amplifier cool and to increase its mean time before failure.

The amplifier gain is primarily controlled by the current injected therein, and this current is roughly in the range of 25 to 500 mA. The gain between the filtered output and the amplifier input is controlled by (1) the gain of the amplifier and (2) the bias current of the laser. These are evident from the quench curves in FIG. 5 when the horizontal axis is translated and scaled to yield the optical power from the quench laser as discussed previously in conjunction with FIG. 5. The gain of the amplifier then determines the magnitude of the stimulated emission quenching the main laser so that larger input signals, represented as changes in the variable for the horizontal axis, yield larger output signals in the laser output as represented by changes in the variable for the vertical axis. The bias current into the main laser decreases the gain at the unfiltered output by reducing the slope of the transfer characteristics as represented by the quench curves in FIG. 5. It should also be noted that the size of the intersection (or intersections in the FIG. 3 embodiment) between the amplifier waveguide and the laser influences the gain, as well as the observed saturation level at the filtered output of the laser, however, this parameter is fixed during fabrication.

The integral formation of an optical laser amplifier with a spontaneous emission filter makes it possible for the first time to amplify optical signals without introducing a high level of noise. Unlike previous optical amplifiers, the amplifier and filter devices constructed in accordance with the present invention can be cascaded without significantly increasing the noise level. It is possible using these devices to detect the signal in what ordinarily would be a low signal-to-noise environment with an ordinary optical amplifier, and without complicated electronics. Using the present invention, optical signals can be reconstructed all-optically for either analog or digital communications. The amplifier with the spontaneous emission filter is faster, cheaper and much less complex than prior art systems performing similar functions.

The dual outputs of the devices are also significant. As discussed previously, one output is for the normally amplified signal, while the other is for the spontaneous-emission-free signal. In addition, the filtered output is inverting in the sense that the laser signal decreases from the quiescent value when an optical signal is present at the input. This leaves the unique feature of one output being the corollary of the other which is very useful for some signal processing applications. For example, the corollary can be used for matching logic families in a digital processing environment. One such application would be a converter from TTL to a dual rail architecture, for example, self electro-optic devices (SEEDs). The corollary can also be used as a built-in error check.

Turning now to the method by which the amplifier and filter devices 10, 110 and 210 of FIGS. 1–3 are fabricated, they are preferably fabricated from Graded Index Separate Confinement Heterostructure (GRINSCH) GaAs-AlGaAs multiple quantum well wafers, preferably with five wells. The laser mirrors and ridge waveguides are etched in a Chemically Assisted Ion Beam Etcher (CAIBE). The facets of the amplifier and quench waveguides are antireflection (AR) coated. These coatings can be fabricated in two separate ways: (1) the amplifiers can be cleaved and then AR coated in a thermal evaporator and (2) they can be coated in-situ when the amplifier is integrated with other devices.

For the prototypes illustrated in FIGS. 1–3, the amplifier and main laser are approximately 5×1000 and 5×150 μm in size, respectively. In the embodiment of FIG. 3, the quench section 218 intersects the Laser 28 five times, thereby forming five of the subregions 234. Electrical isolation between the top pads for the two lasers will be accomplished by a process involving two steps: (1) shallow etches of 2 μm wide and 1.75 μm deep into the p$^+$ GaAs provide up to 1 KΩ of resistance and (2) oxygen ions implanted into the shallow etches raise the resistance by two to three orders of magnitude. This isolation process is new in that it uses shallow etches as the starting level for the implants and does not introduce any additional masking steps during fabrication. It is therefore simpler than other previously used processes. The facets are formed by deep etches of 4.5 μm. A 1300 Angstroms thick $SiO_2$ layer is used as electrical isolation between the metal bending pads in the bare GaAs wafer; it is also used as an etch retardation mask for the shallow etch process.

Large metal bonding pads are then connected to the device as to supply the external bias. The top p$^+$ Ohmic contacts are made by diffusing zinc through openings in the $SiO_2$ layer to the depth of 0.3 μm, evaporating Ti-Pt-Au over the surface and using a lift off process to remove regions of unwanted metal. After lapping the bottom of the wafer to a total wafer thickness of approximately 150 μm, the bottom n$^-$ contact is made by depositing layers of Ge, Ni and Au. Both the p and n Ohmic contacts are simultaneously alloyed prior to cleaving out and testing the devices.

Although the present invention has been described in terms of a number of preferred embodiments, it will be understood that numerous other modifications and variations could be made thereto without departing from the scope of the invention as set forth in the following claims.

What is claimed is:

1. A combined laser amplifier and filter device comprising:
   a) an optical laser amplifier for generating an unfiltered amplified output signal, said unfiltered amplified output signal including a stimulated emission component and a spontaneous emission component;
   b) a laser for generating a filtered output signal; and
   c) means for quenching said laser with the stimulated emission component of said unfiltered amplified output signal, and thereby causing said filtered output signal to be an inverted version of said unfiltered amplified signal with said spontaneous emission component removed.

2. The device of claim 1, wherein said means for quenching comprises means for directing said unfiltered amplified output signal transversely across a cavity of said laser and antireflection means for preventing said unfiltered amplified output signal from reflecting back across said laser.

3. The device of claim 2, wherein said means for directing comprises a first optical waveguide in which said amplifier is formed, said first optical waveguide having an output end positioned adjacent and parallel to a structure forming said laser.

4. The device of claim 3, wherein said optical waveguide and said structure forming said laser are monolithically integrated on a semiconductor substrate.

5. The device of claim 3, wherein said structure forming said laser further comprises a second optical waveguide positioned perpendicular to said first optical waveguide.

6. The device of claim 5, wherein said first and second optical waveguides are monolithically integrated on a semiconductor substrate.

7. The device of claim 6, wherein a multiple quantum well structure is formed in said semiconductor substrate for forming said laser amplifier and said laser in said first and second optical waveguides, respectively.

8. The device of claim 7, wherein said laser is a horizontal cavity edge emitting laser.

9. The device of claim 5, wherein said antireflection means comprises an antireflection coating formed on a sidewall of said second waveguide transversely across said cavity from said output end of said first optical waveguide.

10. The device of claim 5, wherein said antireflection means comprises an optical absorber structure positioned adjacent said second optical waveguide and transversely across said second optical waveguide from said output end of said first optical waveguide.

11. The device of claim 3, wherein said laser is a vertical cavity surface emitting laser, and wherein said amplifier is formed in a first portion of said first optical waveguide, and said laser is formed in a second portion of said first optical waveguide which is separated from said first portion by a vertical cut.

12. The device of claim 11, wherein a multiple quantum well structure is formed in said first optical waveguide for forming said amplifier and said vertical cavity surface emitting laser.

13. The device of claim 11, further including means for supplying separate bias currents to said laser amplifier and said laser.

14. The device of claim 11, wherein said amplifier and said vertical cavity surface emitting laser are monolithically integrated on a semiconductor substrate.

15. The device of claim 11, wherein said second portion of said first optical waveguide further includes a sidewall facet for emitting said unfiltered amplified output signal.

16. The device of claim 3, wherein said structure forming said laser further includes a sidewall facet for emitting said unfiltered amplified output signal.

17. The device of claim 1, wherein said laser amplifier is formed in a first optical waveguide disposed on a semiconductor substrate, said laser is formed in a second optical waveguide formed on said semiconductor substrate, and said means for quenching comprises a zigzag shaped portion of said first optical waveguide having a plurality of parallel legs which are perpendicular to, and intersect, said second optical waveguide.

18. A method for amplifying and filtering an optical signal comprising the steps of:

(a) providing an optical laser amplifier having an output;

(b) providing a laser for generating a filtered output signal;

(c) generating an unfiltered amplified output signal on said output of said optical laser amplifier, said unfiltered amplified output signal including a stimulated emission component and a spontaneous emission component;

(d) quenching said laser with the stimulated emission component of said unfiltered amplified output signal to cause said filtered output signal from said laser to be an inverted version of said unfiltered amplified output signal from said optical laser amplifier with said spontaneous emission component removed.

19. The method of claim 18, wherein said step of quenching further comprises directing said unfiltered amplified output signal transversely across a cavity of said laser, and preventing said unfiltered amplified output signal from reflecting back across said laser cavity.

20. The method of claim 19, wherein the steps of providing an optical laser amplifier and a laser further comprise:

1) forming said optical laser amplifier in a first portion of an optical waveguide;

2) forming said laser as a vertical cavity surface emitting laser in a second portion of said optical waveguide which is separated by a vertical cut from said first portion of said waveguide.

* * * * *